United States Patent
Kenly et al.

(10) Patent No.: US 12,088,308 B1
(45) Date of Patent: Sep. 10, 2024

(54) DYNAMIC STATE MANAGEMENT OF A PHASE-LOCK LOOP (PLL)

(71) Applicant: CIRRUS LOGIC INTERNATIONAL SEMICONDUCTOR LTD., Edinburgh (GB)

(72) Inventors: Stewart G. Kenly, Austin, TX (US); Amar Vellanki, Cedar Park, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 35 days.

(21) Appl. No.: 17/972,739

(22) Filed: Oct. 25, 2022

(51) Int. Cl.
*H03L 7/087* (2006.01)
*H03L 7/097* (2006.01)
*H03L 7/099* (2006.01)

(52) U.S. Cl.
CPC .............. *H03L 7/087* (2013.01); *H03L 7/097* (2013.01); *H03L 7/0992* (2013.01)

(58) Field of Classification Search
CPC ........ H03L 7/087; H03L 7/097; H03L 7/0992
USPC ................... 331/2, 1 A, 16, 18, 46, 179, 17; 327/156; 375/226, 376
See application file for complete search history.

(56) References Cited

U.S. PATENT DOCUMENTS

| | | | |
|---|---|---|---|
| 7,288,975 B2 | 10/2007 | Ngo et al. | |
| 7,558,358 B1 | 7/2009 | Melanson | |
| 2012/0161835 A1* | 6/2012 | David | H03L 7/146 327/157 |

\* cited by examiner

*Primary Examiner* — Arnold M Kinkead
(74) *Attorney, Agent, or Firm* — Mitch Harris Atty at Law, LLC; Andrew M. Harris (57) ABSTRACT

A phase-lock loop (PLL) circuit provides continuous closed-loop operation when switching between operating modes, which may be selection between multiple oscillators, multiple power modes or frequency divider/multipliers of an local clock generator having one or more oscillator circuits, or other changes that may disrupt operation of the PLL. The PLL includes a loop filter having an input coupled to an output of a phase-frequency comparator that compares the output of the oscillator circuit to a reference and a control circuit for storing and restoring the complete state of the loop filter from the storage in response to a change of operating mode, so that a lock time of the phase-lock loop circuit is reduced when selection of one of the at least two selectable different output frequency ranges of the local clock generator is changed.

22 Claims, 5 Drawing Sheets

DYNAMIC STATE MANAGEMENT OF A PHASE-LOCK LOOP (PLL)

BACKGROUND

1. Field of Disclosure

The field of representative embodiments of this disclosure relates to systems including phase-lock loop (PLL) circuit operated in multiple selected modes of operation, and in particular, to PLL circuits in which the state of the loop filter is stored and restored according to the selected modes.

2. Background

Phase-lock loops (PLLs) are commonly used in systems requiring synchronization to an external clock. In particular, both synchronous and asynchronous interfaces, e.g., asynchronous serial communications channels, may require clock multiplication and/or clock reconstruction at a local receiver. Such systems may be required to synchronize to a received clock that has multiple potential operating frequencies, either because the connection is made to different up-stream systems, or because the interface itself supports multiple operating frequencies or a variable frequency of operation.

When the operating frequency to which the PLL changes to a frequency outside of a current operating range of the PLL, it is typically necessary to re-configure the PLL circuit or other parts of the system and allow the PLL to stabilize at the new operating frequency. Such selection may cause considerable delay, in particular in low-jitter clock generation systems, in which the PLL loop bandwidth is very low. A common solution in re-synchronization is to increase the bandwidth of the loop filter temporarily in order to reduce acquisition time, but such operation still introduces a significant delay as the lower-bandwidth operation still requires significant time to achieve lock.

Therefore, it would be advantageous to provide PLL circuits and systems having PLLs that are capable of dynamically synchronizing to a clock signal of selectable frequency with a reduced delay.

SUMMARY

Reduced delay operation of a phase-lock loop (PLL) is achieved in a PLL circuit, systems incorporating the PLL circuit and their methods of operation.

The PLL circuit has a reference input for receiving a reference clock signal, a local clock generator including one or more oscillators that produce an output signal having at least two selectable different output frequency ranges at a local clock generator output in response to a selection control, a phase-frequency comparator having a first input coupled to the reference input and a second input coupled to the local clock generator output, a loop filter having an input coupled to an output of the phase-frequency comparator, and an output coupled to an input of the local clock generator for controlling a frequency of the one or more oscillators. The PLL circuit also includes a storage for storing at least two instances of a complete state of the loop filter, and a control circuit for restoring the complete state of the loop filter from the storage in response to a change of the selection control, whereby a lock time of the phase-lock loop circuit is reduced when selection of one of the at least two selectable different output frequency ranges of the local clock generator is changed.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses systems, circuits and integrated circuits that include a phase-lock loop (PLL) and PLL control circuits. The PLL circuit receives reference clock signal, and synchronizes an oscillator of a local clock generator. The local clock generator produces an output signal having at least two selectable different output frequency ranges that are selected in response to a selection control. The PLL circuit also includes a phase-frequency comparator that compares the reference input and the local clock generator output, and a loop filter that filters the output of the phase-frequency comparator to produce an output that controls the (selected) oscillator in the local clock generator. The PLL circuit also includes a storage for storing at least two instances of a complete state of the loop filter, and a control circuit for restoring the complete state of the loop filter from the storage in response to a change of the selection control, whereby a lock time of the phase-lock loop circuit is reduced when selection of one of the at least two selectable different output frequency ranges of the local clock generator is changed.

Figure 1:
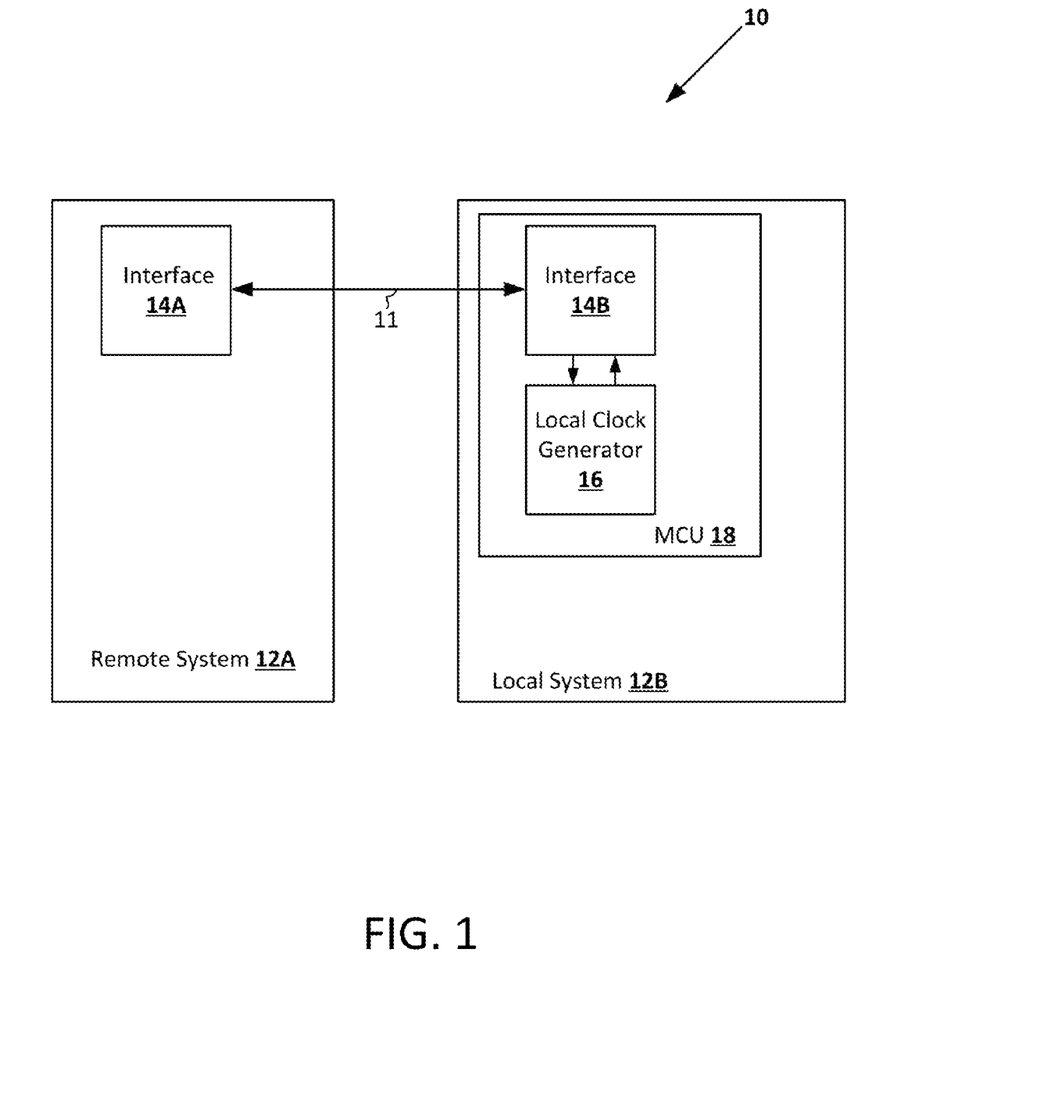
FIG. 1 is a block diagram illustrating an example system 10, in accordance with an embodiment of the disclosure.

Referring now to FIG. 1, a block diagram illustrating an example system 10 is shown, in accordance with an embodiment of the disclosure. Example system 10 illustrates a connection between a remote system 12A and a local system 12B via an interface 11. Interface 11 may be a serial interface connection or a parallel interface connection, and may be synchronous or asynchronous, and although a wired connection is depicted, interface 11 may alternatively be a wireless connection in other example embodiments. An interface 14A within remote system 12A connects to another interface 14B within local system 12B. A local clock generator 16 within a microcontroller unit (MCU) 18 of local system 12B generates one or more clock signals for synchronizing signals received from interface 11 for extracting data and other information received from interface 11 and may generate synchronized clock signals for performing other functions within local system 12B.

Figure 2A:
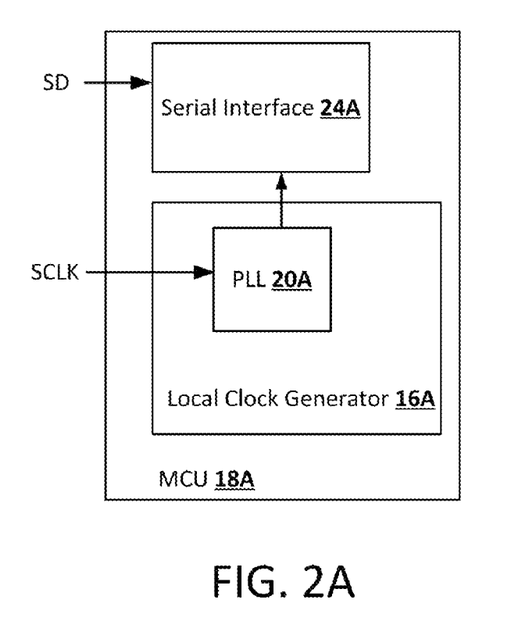
FIG. 2A is a block diagram illustrating details of example interface circuits within a microcontroller unit (MCU) 18A, which may be used to implement MCU in example system 10 of FIG. 1, in accordance with an embodiment of the disclosure.

Referring now to FIG. 2A, a block diagram illustrating details of an example interface circuit within a MCU 18A, which may be used to implement MCU in example system 10 of FIG. 1, is shown, in accordance with an embodiment of the disclosure. MCU 18A includes a serial interface 24A that receives a synchronous serial data SD signal, and a local clock generator 16 that receives a synchronous serial clock signal SCLK, which is provided to a phase-lock loop (PLL) 20A within a local clock generator 16A that generates a stable local clock for detecting data within serial data signal SD by serial interface 24A, and may generate clock signals for other uses within MCU 18A.

Figure 2B:
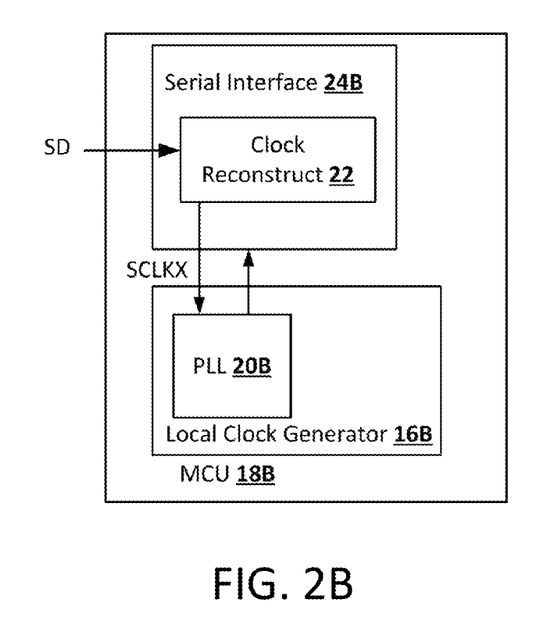
FIG. 2B is a block diagram illustrating details of example interface circuits within a microcontroller unit (MCU) 18B, which may be used to implement MCU in example system 10 of FIG. 1, in accordance with another embodiment of the disclosure.

Referring now to FIG. 2B, a block diagram illustrating details of another example interface circuit within a MCU 18B, which may be used to implement MCU in example system 10 of FIG. 1, is shown, in accordance with an embodiment of the disclosure. MCU 18B includes a serial interface 24B that receives an asynchronous serial data SD signal, and a local clock generator 16B that generates a local clock signal from a reconstructed clock signal SCLKX, which is provided from a clock reconstruct logic 22 within serial interface 24B. A PLL 20B within local clock generator 16B generates reconstructed clock signal SCLKX, a stable local clock for detecting data within serial data signal SD by serial interface 24B, and may generate clock signals for other uses within MCU 18A.

While the example configurations described above depict interface connections generally, the description below is applicable to systems in which the local clock signal is generated under various interchangeable configurations of the system or operating modes of the system, in which one or more elements of a PLL are interchanged with other elements, or operated in different modes, and performance is improved by storing and restoring state information of the PLL when changing the configuration or operating mode. The interchange may be selection among different oscillators as shown in the example below with reference to FIG. 3, or a change between low-power operating mode and normal operating mode, or both. For example, a single digitally-controlled oscillator DCO that has different operating modes, such as a lower-power and higher-power operating mode.

Figure 3:
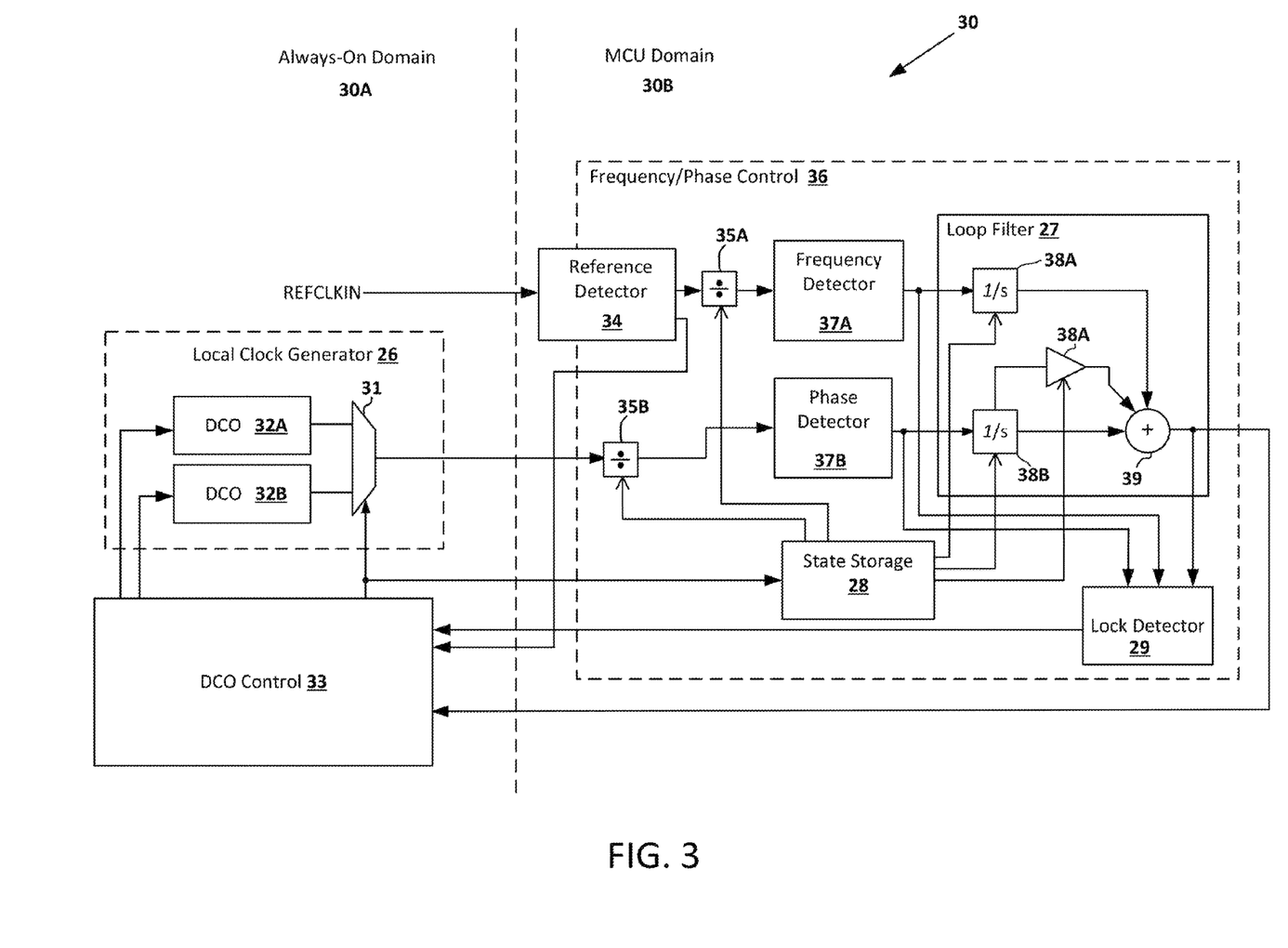
FIG. 3 is a block diagram illustrating details of an example system 30, in accordance with an embodiment of the disclosure.

Referring now to FIG. 3, is a block diagram illustrating details of an example system 30, in accordance with an embodiment of the disclosure. Example system 30 may be used to implement local clock generator 16A of FIG. 2A or local clock generator 16B of FIG. 2B as described above, or may be included in other example systems in which generation of clock signals from a reference clock that may assume multiple reference frequencies is desirable. A reference clock REFCLKIN, which may be serial data clock SCLKIN or reconstructed clock signal SCLKX in the above-described examples, or another reference signal to which phase and frequency synchronization is needed, is received by a reference detector 34 of a frequency/phase control block 36 that is within a power-managed MCU domain 30B. In an always-on domain 30A, a local clock generator 26 generates one or more clock signals that are managed by a digitally-controlled oscillator (DCO) control block 33. In always-on domain 30A, the clock signals are continually generated, but are free-running, except when synchronization to reference clock REFCLKIN is needed and is possible, e.g., when reference clock REFCLKIN is present. To synchronize one of multiple DCOs 32A, 32B within local clock generator 26, DCO control 33 selects the output of one of DCOs 32A, 32B via a multiplexer 31, which, in turn, provides the output of the selected one of DCOs 32A, 32B to frequency/phase control block 36, which forms a PLL with the selected one of DCOs 32A, 32B, by controlling the frequency of the selected one of DCOs 32A, 32B through DCO control block 33. A lock detector 29 provides an indication to DCO control block 33 when the PLL is in a locked condition, i.e., the frequency and phase of the signals at the output of dividers 35A, 35B is sufficiently matched in frequency and phase.

When signal presence is detected on reference clock REFCLKIN by reference detector 34, reference detector 34 wakes up and determines whether or not a signal of valid frequency range is present on reference clock REFCLKIN. If a signal of valid frequency range is not present, frequency/phase control block 36 is not activated. Otherwise, if a signal of valid frequency range is present, frequency/phase control block 36 is activated, and attempts to synchronize one of DCOs 32A, 32B to reference clock REFCLKIN. Based on a determined frequency range, DCO control 33 selects the appropriate one of DCOs 32A, 32B and restores the state of various circuits within frequency/phase control block 36, including the state of a loop filter 27 that filters the outputs of a frequency detector 37A and a phase detector 37B that generate frequency and phase error signals that are filtered by loop filter 27. A state storage 28, which may be a set of registers, memory, e.g., a memory a microcontroller core implementing DCO control 33, or other suitable storage, stores a previous state of the blocks within frequency/phase control block 36 that was stored a previous time that reference clock REFCLKIN was in the frequency range and lock to reference clock REFCLKIN was achieved. State storage 28 may include storage of the states for each of DCOs 32A, 32B, which may include any number of DCOs as needed in system 30, i.e., more than the two DCOs 32A, 32B shown for illustrative purposes. In some embodiments, only a single DCO may be used, but require different characteristics from the loop filter, thus having differing steady-state values for the loop filter state, e.g., in implementations that have a single DCO with two different operating modes corresponding to different power levels/power supply voltages.

State storage 28, which may be implemented by a microcontroller unit (MCU), another type of processor, or hardwired logic, stores and retrieves state information, e.g., the divisor value for a reference clock divider 35A that divides reference clock REFCLKIN by a pre-scale value and a local clock divider 35B that divides the output of local clock generator 16 by a pre-scale value to provide a desired ratio between a frequency of the output of local clock generator 16 and a frequency of reference clock REFCLKIN. Additionally, the entire state of loop filter 27 is stored, by storing the current count values of an integrator 38A that integrates the output of frequency detector, an integrator 38B that integrates the output of phase detector 37B and the multiplier value of a gain element that scales a proportion of an output of phase detector 37B provided to a combiner 39 that combines the outputs of integrators 38A, 38B and gain element 25 to provide proportional-integral (PI) control of a frequency control provided to DCO control block 33, which routes the frequency control value to the selected one of DCOs 32A, 32B. By storing and retrieving the state information of the PLL formed by local clock generator 16 and frequency/phase control block 36, the need to reconfigure the various state-managed circuits is removed to just a selection of which of DCOs 32A, 32B is being synchronized. In particular, the restoration of a previous state of integrators 38A, 38B and gain element 25 not only will set an initial frequency control value that is the same as the previously locked frequency control value, but also integrators 38A, 38B will be in the same state as during previous operation. The state restoration reduces or eliminates any residual lock time required for locking the frequency and phase of the output of local clock generator 16 (as scaled by divider 35B) with reference clock REFCLKIN (as scaled by divider 35A).

Figure 4:
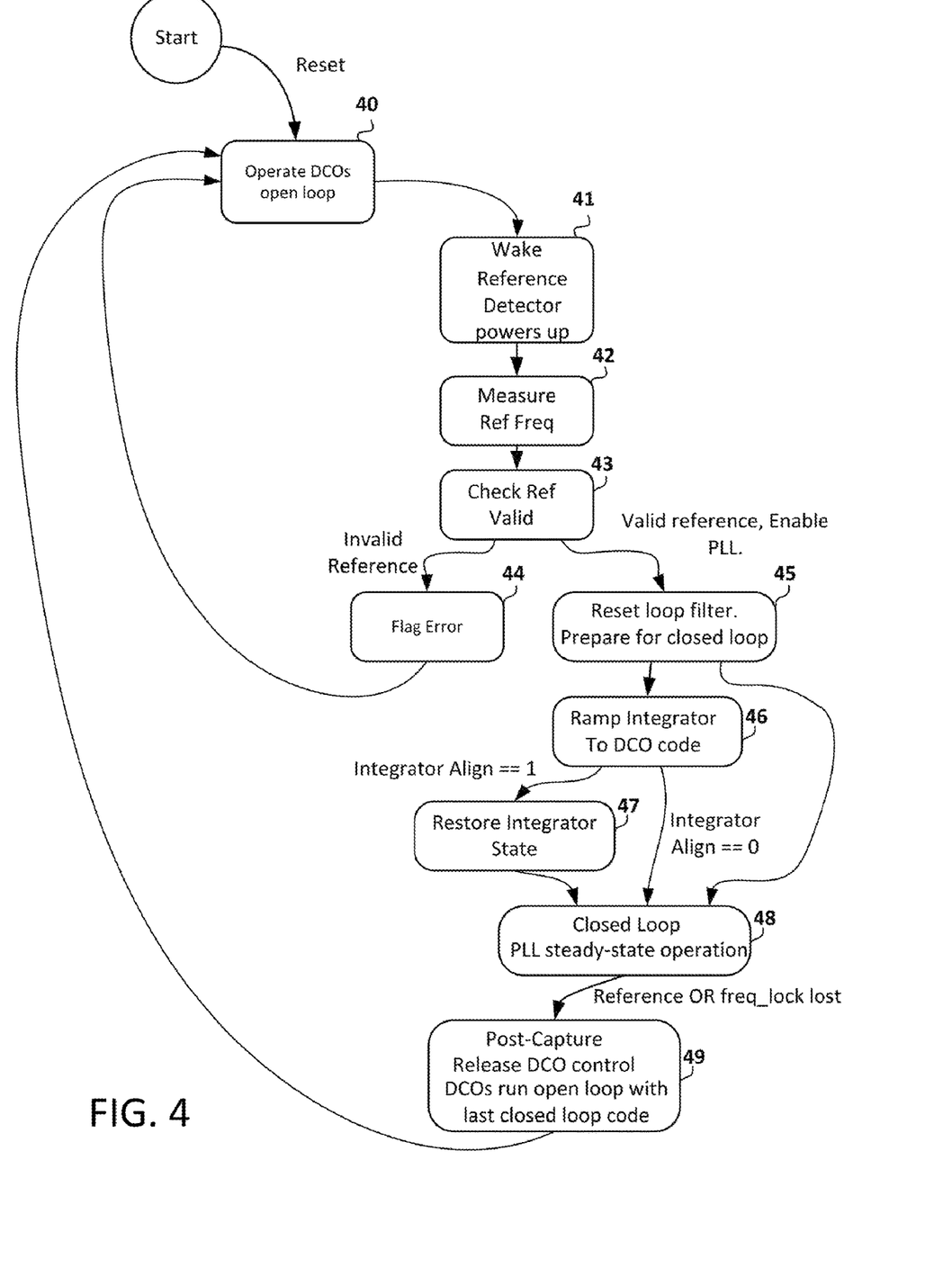
FIG. 4 is an example state diagram illustrating details of operation of example system 30, in accordance with an embodiment of the disclosure.

FIG. 4 is a state diagram illustrating details of an example of operation of example system 30, in accordance with an embodiment of the disclosure. Upon a reset indication, or until a reference clock signal REFCLKIN is detected, DCOs 32A, 32B are operated open-loop (state 40). Once reference clock signal REFCLKIN is detected, reference detector 34 powers up (state 41) and the frequency of reference clock signal REFCLKIN is measured (state 42) and checked to determine if the frequency is valid (state 43). If the frequency is invalid, an error is flagged (state 49), state 40 is resumed, and DCOs 32A, 32B continue to operate open-loop (state 40). Otherwise, loop filter 27 is reset to prepare for closed-loop operation (state 45), and the integrator is ramped to the current DCO frequency control value (state 46). If a flag Integrator Align is set, the integrator state is restored from state storage 28 (state 47), and the loop is allowed to proceed to lock (state 48) for steady-state operation. If reference clock signal REFCLKIN is lost (e.g., disconnected) or the frequency lock is lost (in other words, if flag Integrator align is not set), DCO control is released and DCOs 32A, 32B proceed to operate open-loop (state 49).

Figure 5A:
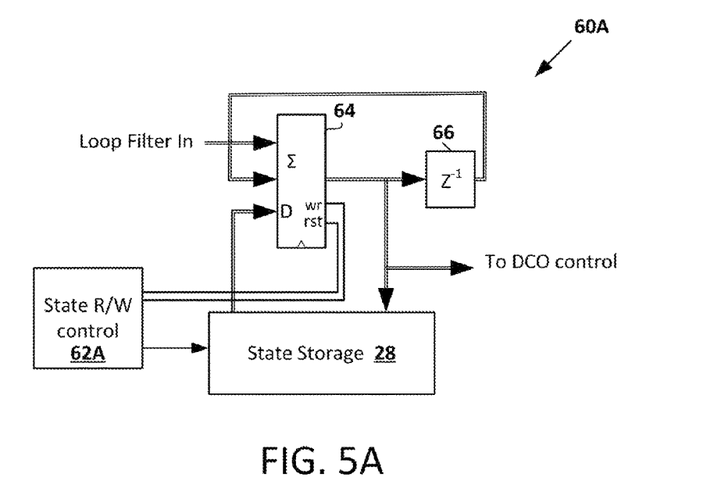
FIG. 5A is a block diagram illustrating an example loop filter integrator circuit 60A, in accordance with an embodiment of the disclosure.

FIG. 5A is a block diagram illustrating an example integrator circuit 60A that may be used to implement integrators 38A, 38B in loop filter 36 of FIG. 3 is shown, in accordance with an embodiment of the disclosure. As described in the above example embodiments, integrator 60A is a digital integrator that receives a digital input value Loop Filter In and generates an output that is provided to PI combiner 39. A readable/writable adder stage 64 has a register that may be accessed by state storage 28 under control of a state read/write (R/W) control block 62A. Digital value In is summed at each update with a feedback value provided by a unit delay 66, so that the value in the register and output of readable/writable adder stage 64 is an integral of digital input In. While the basic integrator illustrated may be sufficient to implement integrators 38A, 38B in loop filter 36 of FIG. 3, other integrator and filter combinations may be used in alternative embodiments of the disclosure, provided that all of the state-holding registers in the integrators/filters may be stored/restored to and from state storage 28.

Figure 5B:
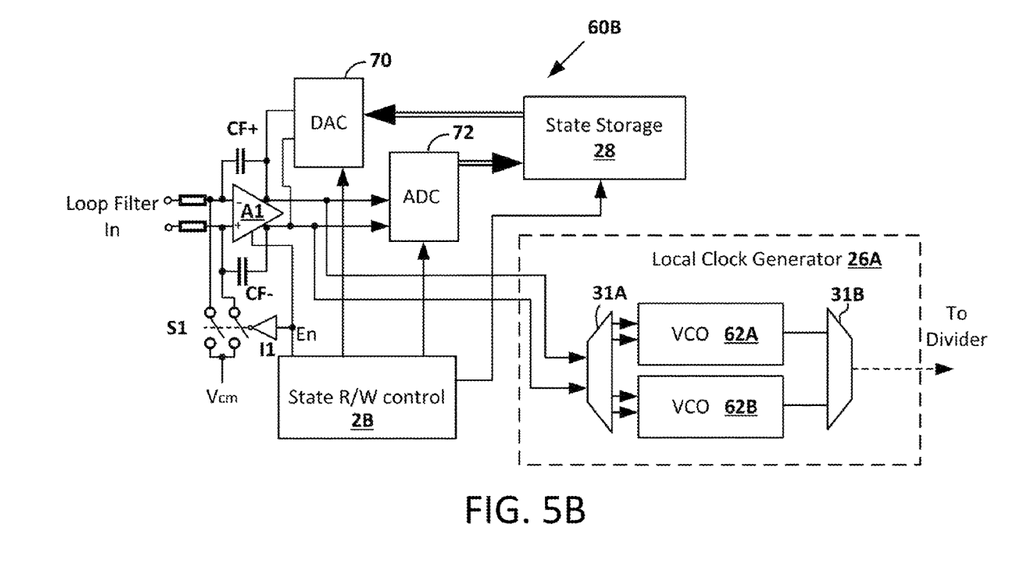
FIG. 5B is a block diagram illustrating an example alternative loop filter integrator circuit 60B, in accordance with another embodiment of the disclosure.

FIG. 5B is a block diagram illustrating an example alternative loop filter integrator circuit 60B, in accordance with another embodiment of the disclosure. Integrator circuit 60B illustrates an analog integrator circuit that may be used to implement integrators 38A, 38B in loop filter 36 of FIG. 3, with appropriate substitutions in system 30. For example, DCOs 32A, 32B may be replaced with voltage-controlled oscillators (VCOs) 62A, 62B, in an analog local clock generator block 26A, as illustrated. A selector 31A and multiplexer 31B, select one of VCOs 62A, 62B for generating the output clock. Gain element 25 and combiner 39 in in loop filter 36 of FIG. 3 may be replaced with an equivalent controllable-gain amplifier and an analog summer, respectively. The state-holding elements of integrator circuit 60B are capacitors CF+, CF− connected to amplifier A1, which has an output that may be disabled by a control signal En provided from a state R/W control 62B. Control signal En is de-asserted when restoring a state of integrator circuit 60B from state storage 28 via digital-to-analog converter (DAC) 70. Switch S1 connects the summing node terminals of capacitors CF+, CF− to a common-mode voltage during the state restore operation and may be activated by an inverter I1 coupled to control signal En. An analog-to-digital converter (ADC) 72 is provided to store the state information by storing the differential voltage across the outputs of amplifier A1.

In summary, this disclosure shows and describes PLL circuits, systems that incorporate the PLL circuits, and their methods of operation. The PLL circuits include a reference input for receiving a reference clock signal, a local clock generator having one or more oscillators that produce an output signal having at least two selectable different output frequency ranges at a local clock generator output in response to a selection control, a phase-frequency comparator having a first input coupled to the reference input and a second input coupled to the local clock generator output, a loop filter having an input coupled to an output of the phase-frequency comparator and an output coupled to an input of the local clock generator for controlling a frequency of the one or more oscillators, a storage for storing at least two instances of a complete state of the loop filter, and a control circuit for restoring the complete state of the loop filter from the storage in response to a change of the selection control, whereby a lock time of the phase-lock loop circuit is reduced when selection of one of the at least two selectable different output frequency ranges of the local clock generator is changed. A system that includes the PLL circuit may be a system that synchronizes to a reference clock assuming multiple differing frequencies.

In some example embodiments, the local clock generator may include at least two digitally-controlled oscillators producing corresponding ones of the two selectable different output frequencies. In other example embodiments, the local clock generator may have a single digitally-controlled oscillator having at least one of programmable multiplier or divider that selects between the at least two selectable different output frequencies. In some example embodiments, the loop filter may include an integrator, and wherein the storage stores multiple states of the integrator. In some example embodiments, the reference clock signal may be provided from an asynchronous serial port (ASP) having a range of operating frequencies, and the selection control may select between the at least two selectable output frequency ranges so that a frequency of the reference clock signal falls with a selected one of the at least two selectable output frequency ranges. In some example embodiments the storage may also store multiple sets of values of at least one of a reference clock divisor or a feedback divisor of the local clock generator and wherein the control circuit selects one of the multiple sets of values for the local clock generator in conformity with the selection control. The selection may be made in accordance with a selection between a high-power operating mode and a low-power operating mode of the local clock generator and/or system, which may be received from a power management unit of the system. In some example system embodiments, the complete state of the phase-lock loop control consists of the complete state of the loop filter, in other example system embodiments, the additional control values associated with the configuration of the system, including clock divisors/feedback divisors, are also stored along with the complete state of the loop filter. In some example system embodiments, the PLL forms part of an asynchronous serial port (ASP) receiver having a range of operating frequencies, the reference clock input may receive the reference clock from the ASP receiver, and the selection control may select between the at least two selectable output frequency ranges so that a frequency of the reference clock signal falls with a selected one of the at least two selectable output frequency ranges.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to another type of control system.

What is claimed is:

1. A phase-lock loop circuit, comprising:
   a reference input for receiving a reference clock signal;
   a local clock generator including one or more oscillators that produce an output signal having at least two selectable different output frequency ranges at a local clock generator output in response to a selection control;
   a phase-frequency comparator having a first input coupled to the reference input and a second input coupled to the local clock generator output;
   a loop filter having an input coupled to an output of the phase-frequency comparator and an output coupled to an input of the local clock generator for controlling a frequency of the one or more oscillators;
   a storage for storing at least two instances of a complete state of the loop filter and multiple sets of values of at least one of a reference clock divisor or a feedback divisor of the local clock generator; and
   a control circuit for restoring the complete state of the loop filter from the storage in response to a change of the selection control, whereby a lock time of the phase-lock loop circuit is reduced when selection of one of the at least two selectable different output frequency ranges of the local clock generator is changed, and wherein the control circuit selects one of the multiple sets of values for the local clock generator in conformity with the selection control.

2. The phase-lock loop circuit of claim 1, wherein the local clock generator comprises at least two digitally-controlled oscillators producing corresponding ones of the two selectable different output frequencies.

3. The phase-lock loop circuit of claim 1, wherein the local clock generator comprises a single digitally-controlled oscillator having at least one of programmable multiplier or divider that selects between the at least two selectable different output frequencies.

4. The phase-lock loop circuit of claim 3, wherein the two different output frequencies correspond to a high-power and a low-power operating mode of the local clock generator.

5. The phase-lock loop circuit of claim 1, wherein the loop filter comprises an integrator, and wherein the storage stores multiple states of the integrator.

6. The phase-lock loop circuit of claim 1, wherein the reference clock signal is provided from an asynchronous serial port (ASP) having a range of operating frequencies, and wherein the selection control selects between the at least two selectable output frequency ranges so that a frequency of the reference clock signal falls with a selected one of the at least two selectable output frequency ranges.

7. A system that synchronizes to a reference clock assuming multiple differing frequencies, the system comprising:
   a local clock generator having a frequency controlled by a frequency control input and including one or more oscillators that produce an output signal having at least two selectable different output frequency ranges at an output of the local clock generator in response to a selection control;
   a reference clock input for receiving the reference clock;
   a phase-lock loop control that compares the reference input to the output of the local clock generator and that generates a frequency control output coupled to the frequency control input of the local clock generator;
   a storage for storing at least two instances of a complete state of the phase-lock loop circuit control; and
   a control circuit for restoring the complete state of the phase-lock loop control from the storage in response to a change of the selection control, whereby a synchronization delay of the system is reduced when selection of one of the at least two selectable different output frequency ranges of the local clock generator is changed, wherein the storage further stores multiple sets of values of at least one of a reference clock divisor or a feedback divisor of the local clock generator and wherein the control circuit selects one of the multiple sets of values for the local clock generator in conformity with the selection control.

8. The system of claim 7, wherein the phase-lock loop control comprises:
   a phase-frequency comparator having a first input coupled to the reference input and a second input coupled to the output of the local clock generator; and
   a loop filter having an input coupled to an output of the phase-frequency comparator and an output coupled to the frequency control input of the local clock generator for controlling a frequency of the one or more oscillators, wherein the complete state of the phase-lock loop control includes a complete state of the loop filter.

9. The system of claim 8, wherein the complete state of the phase-lock loop control consists of the complete state of the loop filter.

10. The system of claim 8, wherein the loop filter comprises an integrator, and wherein the storage stores multiple states of the integrator.

11. The system of claim 7, wherein the local clock generator comprises at least two digitally-controlled oscillators producing corresponding ones of the two selectable different output frequencies.

12. The system of claim 7, wherein the local clock generator comprises a single digitally-controlled oscillator having at least one of programmable multiplier or divider that selects between the at least two selectable different output frequencies.

13. The system of claim 12, further comprising a power management unit that selects between a high-power operating mode and a low-power operating mode of the system, and wherein the power management unit generates the selection control according to a selected one of the high-power operating mode and the low-power operating mode of the system.

14. The system of claim 7, further comprising an asynchronous serial port (ASP) receiver having a range of operating frequencies, wherein the reference clock input receives the reference clock from the ASP receiver, and wherein the selection control selects between the at least two selectable output frequency ranges so that a frequency of the reference clock signal falls with a selected one of the at least two selectable output frequency ranges.

15. A method of synchronizing a local clock to a reference clock assuming multiple differing frequencies, the method comprising:
   receiving a reference clock signal;
   generating an output signal from a local clock generator, wherein the output signal has at least two selectable different output frequency ranges;
   selecting one of the at least two selectable output frequency ranges for the local clock generator;
   comparing a frequency of the reference clock signal and a frequency of the output signal;
   generating a frequency control provided to the local clock generator from a result of the comparing and according to a feedback transfer function forming part of a phase-lock loop response;
   receiving a selection control selecting from among the at least two selectable different output frequency ranges of the local clock generator; and
   responsive to receiving the selection control, storing a complete state of the frequency control and restoring a previously-stored complete state of the frequency control corresponding to a next selected one of the at least two selectable different output frequency ranges of the local clock generator.

16. The method of claim 15, wherein the generating a frequency control is performed by a phase-lock loop control comprising a phase-frequency comparator having a first input coupled to the reference input and a second input coupled to the output of the local clock generator and a loop filter having an input coupled to an output of the phase-frequency comparator and an output coupled to the frequency control input of the local clock generator for controlling a frequency of one or more oscillators of the local clock generator, wherein the complete state of the phase-lock loop control includes a complete state of the loop filter.

17. The method of claim 16, wherein the complete state of the phase-lock loop control consists of the complete state of the loop filter.

18. The method of claim 16, wherein the loop filter comprises an integrator, and wherein the storage stores multiple states of the integrator.

19. The method of claim 15, wherein the local clock generator comprises at least two digitally-controlled oscillators producing corresponding ones of the two selectable different output frequencies.

20. The method of claim 15, wherein the local clock generator comprises a single digitally-controlled oscillator having at least one of programmable multiplier or divider that selects between the at least two selectable different output frequencies.

21. The method of claim 20, further comprising selecting between a high-power operating mode and a low-power operating mode of the local clock generator, and wherein the selecting one of the at least two selectable output frequency ranges for the local clock generator is performed according to the selecting between the high-power operating mode and the low-power operating mode of the local clock generator.

22. The method of claim 15, wherein the storing and restoring further stores and restores multiple sets of values of at least one of a reference clock divisor or a feedback divisor of the local clock generator.

* * * * *

UNITED STATES PATENT AND TRADEMARK OFFICE
CERTIFICATE OF CORRECTION

| | | |
|---|---|---|
| PATENT NO. | : 12,088,308 B1 | Page 1 of 2 |
| APPLICATION NO. | : 17/972739 | |
| DATED | : September 10, 2024 | |
| INVENTOR(S) | : Kenly et al. | |

It is certified that error appears in the above-identified patent and that said Letters Patent is hereby corrected as shown below:

In the Drawings

In Fig. 5B, Sheet 5 of 5, delete "State R/W control 2B" and insert -- State R/W control 62B --, therefor.

In the Specification

In Column 3, Lines 16-17, delete "local clock generator 16" and insert -- local clock generator 16A --, therefor.

In Column 3, Line 50, delete "digitally-controlled oscillator DCO" and insert -- digitally-controlled oscillator (DCO) --, therefor.

In Column 4, Line 35, delete "memory a microcontroller" and insert -- memory of a microcontroller --, therefor.

In Column 4, Lines 56-57, delete "local clock generator 16" and insert -- local clock generator 26 --, therefor.

In Column 4, Lines 58-59, delete "local clock generator 16" and insert -- local clock generator 26 --, therefor.

In Column 5, Line 4, delete "local clock generator 16" and insert -- local clock generator 26 --, therefor.

In Column 5, Line 15, delete "local clock generator 16" and insert -- local clock generator 26 --, therefor.

In Column 5, Line 27, delete "(state 49)," and insert -- (state 44), --, therefor.

Signed and Sealed this
Thirty-first Day of December, 2024

Derrick Brent
*Acting Director of the United States Patent and Trademark Office*

In Column 5, Line 42, delete "loop filter 36" and insert -- loop filter 27 --, therefor.

In Column 5, Line 55, delete "loop filter 36" and insert -- loop filter 27 --, therefor.

In Column 5, Line 64, delete "loop filter 36" and insert -- loop filter 27 --, therefor.

In Column 6, Lines 3-4, delete "in in loop filter 36" and insert -- in loop filter 27 --, therefor.